(12) United States Patent
Lan et al.

(10) Patent No.: US 11,764,293 B2
(45) Date of Patent: Sep. 19, 2023

(54) TRENCH GATE IGBT AND DEVICE

(71) Applicants: GUANGDONG MIDEA WHITE HOME APPLIANCE TECHNOLOGY INNOVATION CENTER CO., LTD., Foshan (CN); MIDEA GROUP CO., LTD., Foshan (CN)

(72) Inventors: Hao Lan, Foshan (CN); Yuxiang Feng, Foshan (CN)

(*) Notice: Subject to any disclaimer, the term of this patent is extended or adjusted under 35 U.S.C. 154(b) by 261 days.

(21) Appl. No.: 17/417,356

(22) PCT Filed: Dec. 17, 2019

(86) PCT No.: PCT/CN2019/125812
§ 371 (c)(1),
(2) Date: Jun. 22, 2021

(87) PCT Pub. No.: WO2020/135138
PCT Pub. Date: Jul. 2, 2020

(65) Prior Publication Data
US 2022/0077307 A1 Mar. 10, 2022

(30) Foreign Application Priority Data
Dec. 25, 2018 (CN) .......................... 201811589486.1

(51) Int. Cl.
H01L 29/739 (2006.01)
H01L 29/423 (2006.01)

(52) U.S. Cl.
CPC ...... *H01L 29/7397* (2013.01); *H01L 29/4236* (2013.01); *H01L 29/42368* (2013.01)

(58) Field of Classification Search
CPC ............. H01L 29/7397; H01L 29/4236; H01L 29/42368
See application file for complete search history.

(56) References Cited

U.S. PATENT DOCUMENTS

| 4,914,058 A | 4/1990 | Blanchard |
| 2003/0030089 A1* | 2/2003 | Sumino ............ H01L 21/76235 257/E21.654 |

(Continued)

FOREIGN PATENT DOCUMENTS

| CN | 102738226 A | 10/2012 |
| CN | 102779842 A | 11/2012 |

(Continued)

OTHER PUBLICATIONS

Notice of Reasons for Refusal, Japanese Application No. 2021-534149, dated Jul. 26, 2022 (9 pages).

(Continued)

*Primary Examiner* — Joseph C. Nicely
(74) *Attorney, Agent, or Firm* — KILPATRICK TOWNSEND & STOCKTON, LLP

(57) ABSTRACT

Provided are a trench gate IGBT and a device. The trench gate IGBT includes an emitting electrode, a p well region, a gate, a gate oxide layer, a drift region and a back collecting electrode. The gate is located in a trench; the gate is isolated from the emitting electrode, the p well region and the drift region by the gate oxide layer; the trench is disposed inside a substrate; and recesses are provided at the boundary of the trench and the drift region. During switching on and off the trench gate IGBT, an interface between the drift region and a side surface of the trench is provided with recess gate oxide layers, so that electron charges can be restrained and accumulated, and improving the conduction capacity.

16 Claims, 2 Drawing Sheets

(56) References Cited

U.S. PATENT DOCUMENTS

| | | | | |
|---|---|---|---|---|
| 2012/0256230 A1* | 10/2012 | Wu | ................... | H01L 29/4236 |
| | | | | 257/E21.384 |
| 2014/0159104 A1 | 6/2014 | Park et al. | | |
| 2014/0167151 A1* | 6/2014 | Yen | ................... | H01L 29/7813 |
| | | | | 438/270 |
| 2020/0013631 A1* | 1/2020 | Borna Tutuc | ..... | H01L 21/76224 |

FOREIGN PATENT DOCUMENTS

| | | |
|---|---|---|
| CN | 107251231 A | 10/2017 |
| CN | 108538912 A | 9/2018 |
| CN | 207966999 U | 10/2018 |
| JP | 2002231945 A | 8/2002 |
| JP | 2012169421 A | 9/2012 |
| JP | 2016157934 A | 9/2016 |
| JP | 2016181617 A | 10/2016 |
| JP | 2016225351 A | 12/2016 |
| KR | 20100001864 A | 1/2010 |

OTHER PUBLICATIONS

The first office action for CN Application No. 201811589486.1, dated Jan. 26, 2021 (14 pages).
International Search Report for PCT/CN2019/125812, dated Mar. 9, 2020 (9 pages).

* cited by examiner

TRENCH GATE IGBT AND DEVICE

CROSS-REFERENCES TO RELATED APPLICATIONS

The present disclosure is a national phase application of International Application No. PCT/CN2019/125812, filed on Dec. 17, 2019, which claims the priority of Chinese Patent Application No. 2018115894861, filed on Dec. 25, 2018, the entireties of which are herein incorporated by reference.

FIELD

The embodiments of the present disclosure relate to the field of semiconductor technology, more particularly to trench gate Insulated Gate Bipolar Transistor (IGBT) and device.

BACKGROUND

IGBT is a compound, fully controlled, and voltage driven power semiconductor device composed of Bipolar Transistor (BJT) and Insulated Gate Field Effect Transistor (MOSFET). The IGBT has the advantages of both the high input impedance of the MOSFET device and the low on-voltage drop of the Power Transistor (i.e. Giant Transistor, referred to as GTR). Because the IGBT has the advantages of low driving power and low saturation voltage drop, the IGBT is currently widely used in every field as a new power electronic device.

The IGBT can be further divided into trench gate IGBT and plane gate IGBT, the performance of the trench gate IGBT can be divided into dynamic characteristics and static characteristics. Among them, the static characteristics are mainly reflected by the on-state voltage drop of the trench gate IGBT, the lower the on-state voltage drop, the lower the on-state power dissipation of the trench gate IGBT, and the better the static characteristics of the trench gate IGBT. On-state characteristics are one of the key parameters which affect dynamic power dissipation.

Currently, the dynamic power dissipation of trench gate IGBT in the prior art cannot meet the requirements of application scenarios, which is a problem needed to be solved urgently in the field of semiconductor technology.

SUMMARY

The embodiments of the present disclosure provide trench gate IGBT and device to solve the problem that the dynamic power consumption of trench gate IGBT is excessively high in the prior art, to have the beneficial effect of reducing the dynamic power consumption of the trench gate IGBT.

According to of the embodiments of the present disclosure, a trench gate IGBT is provided, the trench gate IGBT includes a gate, a drift region, and a gate oxide layer provided on a surface of the gate and a corresponding trench, the trench is provided inside a substrate; and recesses are provided on an interface constituted jointly by the drift region and a side of the trench.

In another embodiment, the plurality of recesses are uniformly arranged inside the trench.

In another embodiment, the gate oxide layer corresponding to a part of the trench constituting the interface with the drift region is thicker than the gate oxide layer corresponding to other parts of the trench.

In another embodiment, the interface constituted by the plurality of recesses forms any one or any combination of following shapes on a side cross-sectional view of the trench gate IGBT: sine waves, rectangular waves, triangular waves and step waves.

In another embodiment, the trench gate IGBT further includes a polycrystalline silicon layer filled in the trench, the polycrystalline silicon layer and the trench are separated by the gate oxide layer.

In another embodiment, the trench gate IGBT further includes a P well region, the P well region is provided on a top of the semiconductor substrate and located above the drift region; the P well region is connected with the drift region and the trench.

In another embodiment, the trench gate IGBT further includes an emitting electrode and a collecting electrode, the collecting electrode is provided on a back of the semiconductor substrate, the collecting electrode is located below the drift region; the emitting electrode is connected with the P well region and the trench respectively.

In another embodiment, the trench gate IGBT further includes a buffer layer located between the collecting electrode and a bottom of the drift region.

In another embodiment, the semiconductor substrate is a silicon substrate with single crystal structure.

According to the embodiments of the present disclosure, a device is provided, the device includes any one of the trench gate IGBT described above.

The embodiments of the present disclosure provide trench gate IGBT and device to improve the trench gate IGBT in the prior art. The improved trench gate IGBT includes a gate, a gate oxide layer provided on a surface of the gate and a corresponding trench, the trench is provided inside a substrate, and recesses are provided on an interface constituted jointly by a drift region and a side of the trench. In the switching process of the trench gate IGBT, the gate oxide layer corresponding to the plurality of recesses can bind and accumulate electron charges, thus improving the on-state capability, solving the problem that the dynamic power consumption of trench gate IGBT is excessively high in the prior art, and having the beneficial effect of reducing the dynamic power consumption of the trench gate IGBT.

BRIEF DESCRIPTION OF THE DRAWINGS

In order to illustrate the embodiments of the present disclosure in the prior art more clearly, figures used in the description of embodiments and the prior art are briefly introduced as follows.

DETAILED DESCRIPTION OF THE DISCLOSURE

The performance of the trench gate IGBT can be divided into dynamic characteristics and static characteristics. Among them, the static characteristics are mainly reflected by the on-state voltage drop of the trench gate IGBT, the lower the on-state voltage drop, the lower the on-state power dissipation of the trench gate IGBT, and the better the static characteristics of the trench gate IGBT. On-state characteristics are one of the key parameters which affect the dynamic power dissipation.

Figure 1:
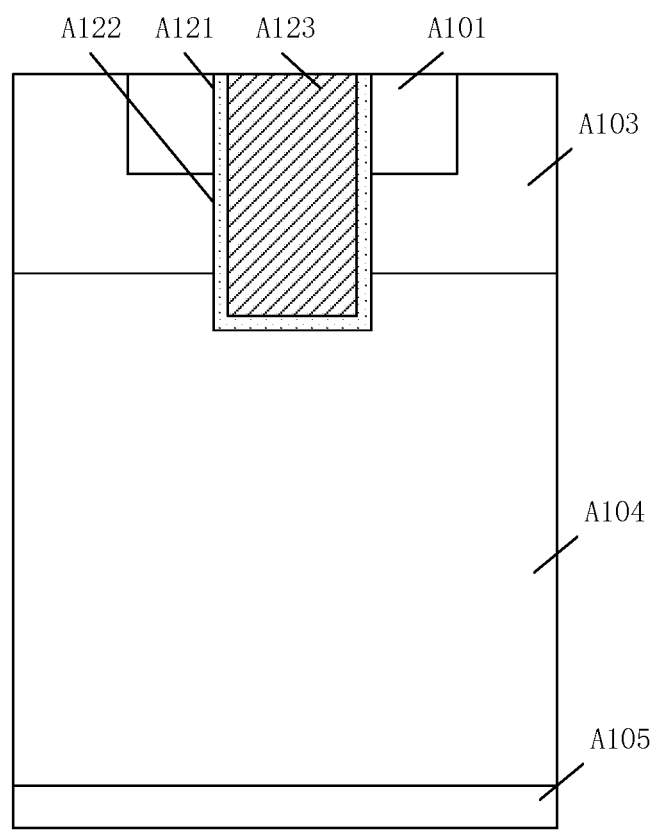
FIG. 1 is a cross-sectional view of a trench gate IGBT chip in the prior art.

A cross-sectional view of a trench gate IGBT chip in the prior art is shown in FIG. 1, the trench gate IGBT includes an emitting electrode A101, a trench A121, a trench gate oxide layer A122, a polycrystalline silicon gate A123, a P well region A103, a drift region A104 and a collecting electrode A105.

When the IGBT is on state, electrons are injected from the emitting electrode A101 into the drift region A104, holes are injected from collecting electrode A105 into the drift region A104, and then conductivity modulation effect takes place between electrons and holes in the drift region A104, the conductivity modulation effect reduces the on-state voltage drop of the IGBT. When the IGBT is turned off, the holes in the drift region A104 are mainly eliminated by recombination with the electrons in the drift region A104, and realizing the turn-off of the IGBT; however, the recombination speed of holes and electrons is low, therefore the IGBT takes a long time to turn off, and the turn-off power consumption of the IGBT is high.

To solve at least one of the problems described above, the embodiments of the present disclosure provide a trench gate IGBT. The trench gate IGBT includes a gate, a gate oxide layer provided on a surface of the gate and a corresponding trench, the trench is provided inside a substrate, and recesses is provided on the boundary between the trench and a drift region, the plurality of recesses has the beneficial effect of reducing the dynamic power consumption of the trench gate IGBT.

Embodiments of the present disclosure will be described below with reference to the figures.

Figure 2:
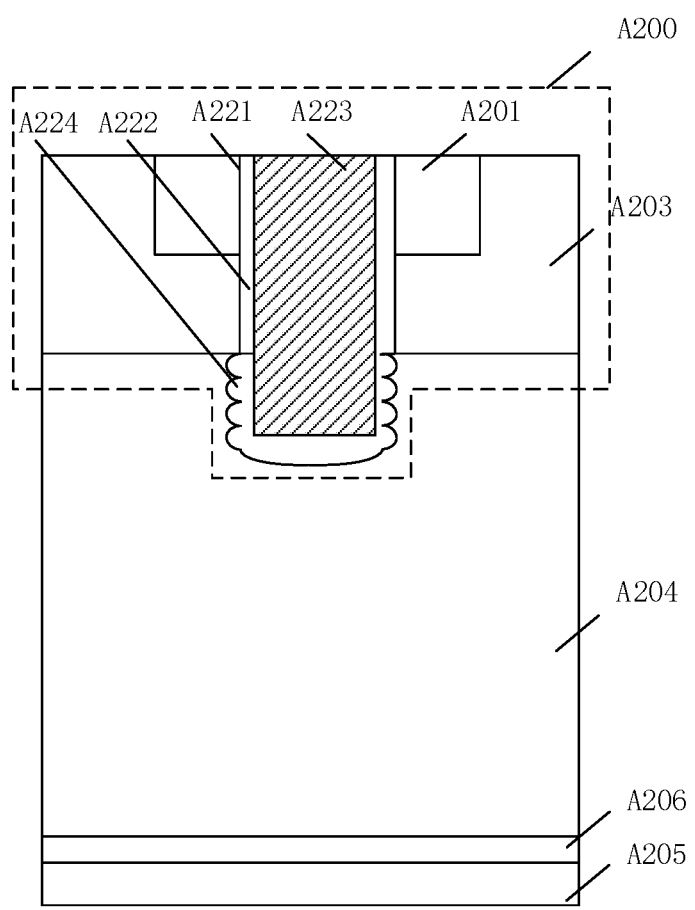
FIG. 2 is a cross-sectional view of a trench gate IGBT chip provided in the embodiments of the present disclosure.

FIG. 2 is a cross-sectional view of a trench gate IGBT chip provided in the embodiments of the present disclosure.

Referring to FIG. 2, the trench gate IGBT chip provided by the embodiments of the present disclosure includes a silicon wafer substrate, an active region A200 provided on a first surface of the silicon wafer substrate, a drift region A204 and a collecting electrode A205 provided on a second surface of the silicon wafer; the drift region A204 connects the active region A200 and the collecting electrode A205.

The active region A200 includes an emitting electrode A201, a trench A221, a polycrystalline silicon A223, a wavy trench gate oxide layer A224 and a P well region A203. An ordinary trench gate oxide layer A222 is formed on an adjacent part of the trench A221 and the emitting electrode A201, and an adjacent part of the trench A221 and the P well region A203. Recesses are formed on an adjacent part of the trench A221 and the drift region A204, the plurality of recesses form uniform waves, on which the wavy trench gate oxide layer A224 is formed. The P well region A203 connects the emitting electrode A201 and the drift region A204. The trench A221 crosses through the emitting electrode A201 and the P well region A203, and then extends into the drift region A204. The ordinary trench gate oxide layer A222 and the wavy trench gate oxide layer A224 coating a surface of the trench A221, the ordinary oxide layer A222 is adjacent to the emitting electrode A201 and the P well region A203, and the wavy trench gate oxide layer A224 is adjacent to the drift region A204; the trench A221 is filled with polycrystalline silicon layer A223.

Among them, it should be emphasized that each of the plurality of recesses may have different or same shapes, which is not specifically limited in the embodiments of the present disclosure; meanwhile, the shape of each of the plurality of recesses may be rectangular, triangular, circular arc, trapezoid and so on, which is also not specifically limited in the embodiments of the present disclosure.

In another embodiment, the trench gate IGBT provided in the embodiments of the present disclosure further includes a buffer layer A206, which is located between the collecting electrode A205 and a bottom of the drift region A204. In one embodiment, the buffer layer A206 has the beneficial effect of electric field cutoff, which can prevent the IGBT from being broken down or broken down in advance effectively.

In another embodiment, the plurality of recesses form acute angles or obtuse angles with the openings of the angles toward the drift region A204.

Furthermore, active regions are the regions on the silicon wafer where the active devices are made. Active devices must be applied with an appropriate bias voltage to function properly. such as BJT, the BJT is in operating condition of amplification only when the emitting electrode is positive biased, and the collecting electrode is reverse biased, and the operating condition of BJT varies with bias voltage. There is also a MOS tube; the MOS tube is in operating condition only when bias voltage is applied to the gate to reverse the channel pattern. Otherwise, the MOS tube won't work no matter how the bias voltage is applied to the source and the drain. Such devices, which depend on an external power source to work, are called active devices. Therefore, in general, the devices which have two ends are passive device (excepting for diodes, diodes are active devices), the devices which have more than three ends are active devices.

The present disclosure provides recesses on the side of the trench A221 adjacent to the drift region A204, so that the gate oxide layer corresponding to the boundary part of the trench A221 and the drift region A204 is thicker, the gate capacitance is reduced, and the switching speed is improved. In the switching process of the IGBT, the boundary of the gate oxide layer corresponding to the plurality of recesses can bind and accumulate electron charges because of a concave structure, thus improving the on-state capacity. Therefore, the switching time of the IGBT can be shortened, the on-state characteristics can be improved, and the power dissipation of the IGBT can be reduced.

On a cross-sectional view of a trench gate IGBT, the plurality of recesses form any one or any combination of the following shapes: sine waves, rectangular waves, triangular waves and step waves.

Referring to FIG. 2, the trench gate IGBT chip provided in the present disclosure includes a silicon wafer substrate, an active region A200 provided on a first surface of the silicon wafer, a drift region A204 and a collecting electrode A205 provided on a second surface of the silicon wafer. The drift region A204 connects the active region A200 and the collecting electrode A205.

The active region A200 includes an emitting electrode A201, a trench A221, an ordinary trench gate oxide layer A222, a polycrystalline silicon A223, a wavy trench gate oxide layer A224 and a P well region A203. The P well region A203 connects the emitting electrode A201 and the drift region A204. The trench A221 crosses through the emitting electrode A201, the P well region A203 and the drift region A204. The ordinary trench gate oxide layer A222 and the wavy trench gate oxide layer A224 coating a surface of the trench A221, the ordinary trench gate oxide layer A222 is adjacent to the emitting electrode A201 and the P well region A203, and the wavy trench gate oxide layer A224 is adjacent to the drift region A204. The trench A221 is filled with polycrystalline silicon layer A223.

The ordinary trench gate oxide layer A222 and the wavy trench gate oxide layer A224 together form the gate oxide layer. The thickness of the silicon dioxide A223 is 0.15 um, the width of the trench A221 is 1.5 um, and the depth of the trench A221 is 5.5 um-10 um. The wavy trench gate oxide layer A224 is obtained by multiple anisotropic and isotropic etching, and then by oxidation and deposition. The thickness of the emitting electrode A201 is 0.5 um, the thickness of the P well region A203 is 2.8 um, the thickness of the drift area A204 is 70 um, and the thickness of the collecting electrode A205 is 0.5 um. The doping concentration of the emitting electrode A201 is $5*10^{19}/cm^{-3}$, the doping concentration of the P well region A203 is $4*10^{16}/cm^{-3}$, the doping concentration of the drift region A204 is $1.5*10^{14}/cm^{-3}$, and the doping concentration of the collecting electrode A205 is $8*10^{17}/cm^{-3}$.

For the IGBT, when it is on state, electrons are injected from the emitting electrode A101 into the drift region A104, holes are injected from collecting electrode A105 into the drift region A104. Based on the switching characteristics and the on-state characteristics of the trench gate IGBT, the embodiment transfer the ordinary trench gate oxide layer A222 adjacent to the drift region A204 to the wavy trench gate oxide layer A224 by multiple anisotropic and isotropic etching and others process. Therefore, the gate oxide layer corresponding to the boundary part of the trench A221 and the drift region A204 is relatively thick, which reduces the gate capacitance and improves the switching speed. The plurality of recesses between the ripples of the wavy trench gate oxide layer A224 can bind and accumulate electron charges in the switching process of the trench gate IGBT, thus improving the on-state capacity.

Based on any one of the foregoing embodiments of the present disclosure, a device is provided, the device includes any one of the trench gate IGBT described above.

As one of the important high-power mainstream devices in power electronics, IGBT has been widely used in the fields such as household appliances, transportation, power engineering, renewable energy, smart grid and so on. In industrial applications, IGBT is widely used in traffic control, power conversion, industrial motors, uninterruptible power supply, wind and solar power equipment, and the frequency converter used for automatic control. In consumer electronics, IGBT is widely used in household appliances, cameras and mobile phones. The type of the devices described in the embodiments of the present disclosure is not specifically limited, any devices in which IGBT is applied are considered to be the devices protected in the embodiments of the present disclosure.

Finally, the embodiments of the present disclosure provide trench gate IGBT and device to improve the trench gate IGBT in the prior art. The improved trench gate IGBT includes a gate, a gate oxide layer provided on a surface of the gate and a corresponding trench, the trench is provided inside a substrate, and recesses are provided on the boundary between the trench and a drift region. In the switching process of the trench gate IGBT, the gate oxide layer, which corresponds to the plurality of recesses provided on the boundary between the trench and the drift region, can bind and accumulate electron charges, thus improving the on-state capacity, solving the problem of excessively high dynamic power consumption of the trench gate IGBT in the prior art, and having the beneficial effect of reducing the dynamic power consumption of the trench gate IGBT.

The above described device implementations are merely exemplary. The units described as separate components may or may not be physically separated, the components illustrated as units may or may not be physical units, that is, they may be in the same place or may be distributed to multiple network elements. All or part of the units may be selected according to actual needs to achieve the purpose of the embodiments of the implementations.

Through the description of the above implementations, those skilled in the art can clearly understand that various implementations can be implemented via software and a necessary universal hardware platform, or via hardware. Based on such understanding, the embodiments of the present disclosure essentially, or the part of the embodiments that contributes to the related art, or all or part of the embodiments, may be embodied in the form of a software product which is stored in a computer readable storage medium (for example, a read-only memory (ROM), a random-access memory (RAM), Disk, compact disc (CD), or the like) and includes instructions for causing a computer device (which may be a personal computer, a server, or a network device and so on) to perform all or part of the operations described in the various implementations of the present disclosure.

What is claimed is:

1. A trench gate Insulated Gate Bipolar Transistor (IGBT), comprising a gate, a drift region, and a gate oxide layer provided on a surface of the gate and a corresponding trench, the corresponding trench being provided inside a substrate, wherein a plurality of recesses are provided on an interface constituted jointly by the drift region and a side of the trench;
wherein the gate oxide layer corresponding to a part of the trench constituting the interface with the drift region is thicker than the gate oxide layer corresponding to other parts of the trench.

2. The trench gate IGBT according to claim 1, wherein the plurality of recesses are uniformly arranged inside the trench.

3. The trench gate IGBT according to claim 1, wherein the interface constituted by the plurality of recesses forms any one or any combination of following shapes on a side cross-sectional view of the trench gate IGBT: sine waves, rectangular waves, triangular waves and step waves.

4. The trench gate IGBT according to claim 1, wherein the gate is made of polycrystalline silicon, the gate and the trench being separated by the gate oxide layer.

5. The trench gate IGBT according to claim 1, further comprising a P well region, the P well region being provided on a top of the substrate and located upon the drift region, the P well region being connected with the drift region and the trench.

6. The trench gate IGBT according to claim 5, further comprising an emitting electrode and a collecting electrode, the collecting electrode being provided on a back of the substrate, the collecting electrode being located below the drift region, the emitting electrode being connected with the P well region and the trench respectively.

7. The trench gate IGBT according to claim 6, further comprising a buffer layer located between the collecting electrode and a bottom of the drift region.

8. The trench gate IGBT according to claim 1, wherein the substrate is a silicon substrate with single crystal structure.

9. A device, comprising
a trench gate Insulated Gate Bipolar Transistor (IGBT), comprising:
a gate, a drift region, and a gate oxide layer provided on a surface of the gate and a corresponding trench, the trench being provided inside a substrate, wherein a plurality of recesses are provided on an interface constituted jointly by the drift region and a side of the trench;

wherein the gate oxide layer corresponding to a part of the trench constituting the interface with the drift region is thicker than the gate oxide layer corresponding to other parts of the trench.

10. The device according to claim 9, wherein the plurality of recesses are uniformly arranged inside the trench.

11. The device according to claim 9, wherein the interface constituted by the plurality of recesses forms any one or any combination of following shapes on a side cross-sectional view of the trench gate IGBT: sine waves, rectangular waves, triangular waves and step waves.

12. The device according to claim 9, wherein the gate is made of polycrystalline silicon, the gate and the trench being separated by the gate oxide layer.

13. The device according to claim 9, wherein the trench gate IGBT further comprises a P well region, the P well region being provided on a top of the substrate and located upon the drift region, the P well region being connected with the drift region and the trench.

14. The device according to claim 13, wherein the trench gate IGBT further comprises an emitting electrode and a collecting electrode, the collecting electrode being provided on a back of the substrate, the collecting electrode being located below the drift region, the emitting electrode being connected with the P well region and the trench respectively.

15. The device according to claim 14, wherein the trench gate IGBT further comprises a buffer layer located between the collecting electrode and a bottom of the drift region.

16. The device according to claim 9, wherein the substrate is a silicon substrate with single crystal structure.

\* \* \* \* \*